(12) United States Patent
Kotani et al.

(10) Patent No.: US 10,622,469 B2
(45) Date of Patent: Apr. 14, 2020

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventors: Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/975,938

(22) Filed: May 10, 2018

(65) Prior Publication Data

US 2018/0337271 A1 Nov. 22, 2018

(30) Foreign Application Priority Data

May 16, 2017 (JP) .................. 2017-097216

(51) Int. Cl.
| | | |
|---|---|---|
| *H01L 29/778* | (2006.01) | |
| *H01L 29/66* | (2006.01) | |
| *H01L 29/10* | (2006.01) | |
| *H01L 29/36* | (2006.01) | |
| H01L 29/20 | (2006.01) | |
| H01L 29/423 | (2006.01) | |
| H01L 29/08 | (2006.01) | |

(52) U.S. Cl.
CPC ...... *H01L 29/7787* (2013.01); *H01L 29/1041* (2013.01); *H01L 29/36* (2013.01); *H01L 29/66462* (2013.01); *H01L 29/0843* (2013.01); *H01L 29/2003* (2013.01); *H01L 29/42316* (2013.01)

(58) Field of Classification Search
CPC .... H01L 29/778; H01L 29/2003; H01L 29/36
See application file for complete search history.

(56) References Cited

U.S. PATENT DOCUMENTS

| | | | | |
|---|---|---|---|---|
| 9,691,890 B2 * | 6/2017 | Nakamura | ............... | H03F 3/245 |
| 10,211,297 B2 * | 2/2019 | Liu | ........ | H01L 29/365 |
| 2012/0155120 A1 * | 6/2012 | Sugawara | ............... | H02M 1/34 |
| | | | | 363/21.12 |

(Continued)

FOREIGN PATENT DOCUMENTS

| | | |
|---|---|---|
| JP | 2005-302861 | 10/2005 |
| JP | 2007-200975 | 8/2007 |

*Primary Examiner* — Cuong Q Nguyen
*Assistant Examiner* — Shih Tsun A Chou
(74) *Attorney, Agent, or Firm* — Fujitsu Patent Center

(57) ABSTRACT

A compound semiconductor device includes an electron transit layer, a spacer layer disposed on the electron transit layer, and an electron supply layer disposed on the spacer layer and containing a donor impurity. The electron supply layer has a concentration distribution of the donor impurity where the donor impurity is at a first concentration at an interface between the electron supply layer and the spacer layer and at a second concentration lower than the first concentration at an upper surface of the electron supply layer, and a concentration of the donor impurity at one of arbitrarily-selected two positions closer to the upper surface in a thickness direction of the electron supply layer is less than the concentration of the donor impurity at another one of the two positions closer to the interface in the thickness direction.

13 Claims, 11 Drawing Sheets

(56) References Cited

U.S. PATENT DOCUMENTS

| | | | | |
|---|---|---|---|---|
| 2013/0069208 A1* | 3/2013 | Briere | ............... | H01L 21/0237 |
| | | | | 257/655 |
| 2014/0291725 A1* | 10/2014 | Ishiguro | ............ | H01L 21/02381 |
| | | | | 257/190 |
| 2017/0117404 A1* | 4/2017 | Era | ................... | H01L 29/7786 |

* cited by examiner

COMPOUND SEMICONDUCTOR DEVICE AND METHOD FOR MANUFACTURING THE SAME

CROSS-REFERENCE TO RELATED APPLICATION

This application is based upon and claims the benefit of priority of Japanese Patent Application No. 2017-097216 filed on May 16, 2017, the entire contents of which are incorporated herein by reference.

FIELD

An aspect of this disclosure relates to a compound semiconductor device and a method of manufacturing the compound semiconductor device.

BACKGROUND

Application of nitride semiconductors having a high saturation electron velocity and a wide band gap to high-voltage, high-power semiconductor devices is being considered. For example, GaN, which is a nitride semiconductor, has a band gap of 3.4 eV that is greater than the band gap (1.1 eV) of Si and the band gap (1.4 eV) of GaAs, and has a high breakdown field strength. For this reason, GaN is a very promising material for a high-voltage-operation, high-power semiconductor device for a power supply.

Many reports have been made on field effect transistors, particularly, high electron mobility transistors (HEMT), which are examples of semiconductor devices using nitride semiconductors.

For example, a GaN HEMT, which uses GaN as an electron transit layer and AlGaN (InAlGaN) as an electron supply layer, is getting attention (see, for example, Japanese Laid-Open Patent Publication No. 2007-200975 and Japanese Laid-Open Patent Publication No. 2005-302861).

In a HEMT, due to the balance between the amounts of polarization charge in the electron transit layer and the electron supply layer, a high-concentration of two-dimensional electron gas (2DEG) is generated near the interface between the electron transit layer and the electron supply layer. The electron mobility of the 2DEG influences the performance of a transistor. As the electron mobility of the 2DEG increases, the current driving force of a transistor increases. To improve the electron mobility of the 2DEG, a spacer layer may be provided between the electron supply layer and the electron transit layer. The spacer layer has a low electron affinity and functions as a barrier against the 2DEG. Accordingly, providing the spacer layer between the electron supply layer and the electron transit layer prevents penetration of the wave function of the 2DEG into the electron supply layer. This in turn reduces the access resistance (channel resistance) and improves the electron mobility.

SUMMARY

An aspect of this disclosure provides a compound semiconductor device that includes an electron transit layer, a spacer layer disposed on the electron transit layer, and an electron supply layer disposed on the spacer layer and containing a donor impurity. The electron supply layer has a concentration distribution of the donor impurity where the donor impurity is at a first concentration at an interface between the electron supply layer and the spacer layer and at a second concentration lower than the first concentration at an upper surface of the electron supply layer, and a concentration of the donor impurity at one of arbitrarily-selected two positions closer to the upper surface in a thickness direction of the electron supply layer is less than the concentration of the donor impurity at another one of the two positions closer to the interface in the thickness direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

With the above-described configuration where a spacer layer is inserted between the electron supply layer and the electron transit layer, the spacer layer may block electron transport at an ohmic contact and increase the contact resistance.

An aspect of this disclosure makes it possible to provide a highly-reliable compound semiconductor device where both the access resistance and the contact resistance are reduced and a method of manufacturing the compound semiconductor device.

<First Embodiment>

Figure 1A:
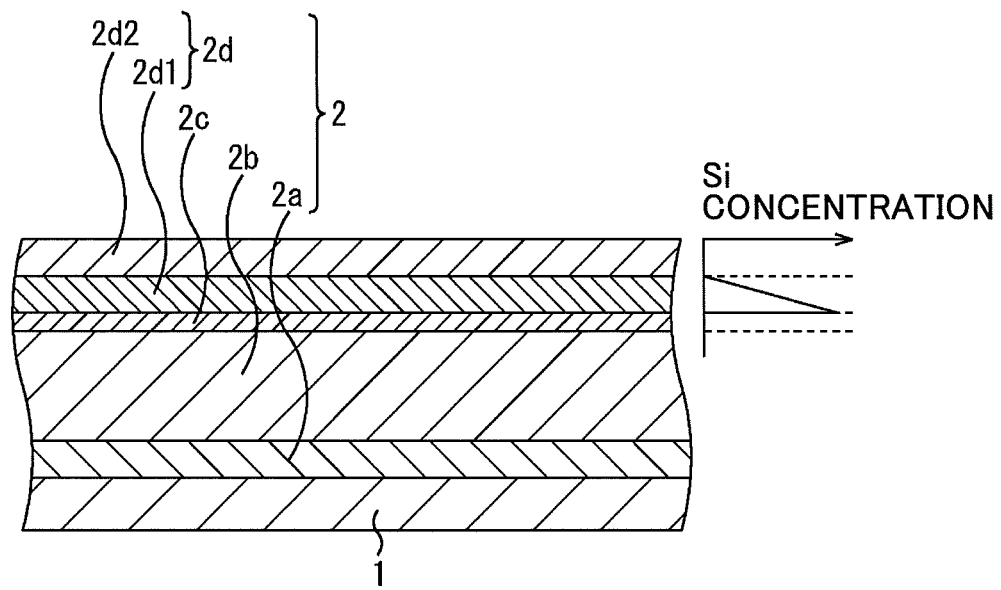
FIGS. 1A through 1C are drawings used to describe a method of manufacturing a GaN-HEMT according to a first embodiment.

A GaN-HEMT according to a first embodiment is described below as an example of a nitride semiconductor device. FIGS. 1A through 2 are drawings used to describe a method of manufacturing the GaN-HEMT according to the first embodiment.

First, as illustrated by FIG. 1A, a compound semiconductor multilayer structure 2 is formed on an Si substrate 1 that is an example of a growth substrate. As the growth substrate, an SiC substrate, a sapphire substrate, a GaAs substrate, or a GaN substrate may also be used instead of the Si substrate. Also, the growth substrate may have either a semi-insulating property or a conductive property.

The compound semiconductor multilayer structure 2 includes a buffer layer 2a, an electron transit layer 2b, a spacer (intermediate) layer 2c, and an electron supply layer 2d.

In an AlGaN or GaN HEMT, a two-dimensional electron gas (2DEG) is generated in the electron transit layer 2b at a position near the interface between the electron transit layer 2b and the electron supply layer 2d (precisely, the spacer layer 2c). The 2DEG is generated due to a difference between the lattice constant of a compound semiconductor (e.g., GaN) forming the electron transit layer 2b and the lattice constant of a compound semiconductor (e.g., AlGaN) forming the electron supply layer 2d.

In the first embodiment, the electron transit layer 2b is comprised of an intentionally-undoped GaN (i-GaN), the spacer layer 2c is comprised of AlGaN or InAlGaN, and the electron supply layer 2d is comprised of AlGaN or InAlGaN. The relationship among the electron affinities of the electron transit layer 2b, the spacer layer 2c, and the electron supply layer 2d is represented by "electron transit layer 2b>electron supply layer 2d>spacer layer 2c". This relationship ensures the electron confinement effect of the spacer layer 2c and improves the electron mobility. To achieve this relationship, when the space layer 2c is comprised of $Al_aGa_{1-a}N$ and the electron supply layer 2d is comprised of $Al_bGa_{1-b}N$, "a>b" and "$0.1 \leq a \leq 1$" need to be satisfied. Also, when the space layer 2c is comprised of $Al_aGa_{1-a}N$ and the electron supply layer 2d is comprised of $In_bAl_cGa_{1-b-c}N$, "a>c" and "b≥0" need to be satisfied. Further, when the space layer 2c is comprised of $In_aAl_bGa_{1-a-b}N$ and the electron supply layer 2d is comprised of $In_cAl_dGa_{1-c-d}N$, "a≤c" and "b≤d" need to be satisfied.

The electron supply layer 2d has a donor (n-type) impurity concentration distribution where the n-type impurity is at a first concentration (maximum value) at the interface between the electron supply layer 2d and the spacer layer 2c and at a second concentration (minimum value) lower than the first concentration at the upper surface of the electron supply layer 2d, and the concentration of the n-type impurity at one of arbitrarily-selected two positions closer to the upper surface in the thickness direction is less than the concentration of the n-type impurity at the other one of the two positions closer to the interface in the thickness direction. One or more elements selected from silicon (Si), germanium (Ge), and oxygen (O) are used as the n-type impurity. In the first embodiment, the electron supply layer 2d includes a lower first layer 2d1 doped with, for example, Si and an upper undoped second layer 2d2 stacked on the first layer 2d1, and only the first layer 2d1 contains the n-type impurity with the concentration distribution described above.

More specifically, in the first layer 2d1, as indicated by a graph on the right side of FIG. 1A, the Si concentration is at the maximum value at the interface with the spacer layer 2c and gradually decreases as the distance from the interface increases (or as the position becomes closer to the interface with the second layer 2d2). The spacer layer 2c may also be doped with Si. Forming the electron supply layer 2d having an Si concentration distribution as described above, i.e., having a high concentration of n-type impurity at the interface with the spacer layer 2c, makes it possible to reduce the contact resistance even when the spacer layer 2c is provided to reduce the access resistance. Thus, the configuration of the first embodiment makes it possible to reduce both the access resistance and the contact resistance. Further, with the above Si concentration distribution, it is possible to make the total amount of Si used as the n-type impurity as small as possible and prevent excessive Si doping. This in turn makes it possible to reduce the contact resistance without reducing the crystallinity of the electron supply layer 2d.

The compound semiconductor multilayer structure 2 is formed by growing compound semiconductors on the Si substrate 1 by, for example, metal-organic vapor-phase epitaxy (MOVPE) as described below. Instead of MOVPE, any other appropriate method such as molecular beam epitaxy (MBE) may be used.

First, as an initial layer (not shown), AlN is grown on the Si substrate 1 to a thickness of about 160 nm. Next, the buffer layer 2a is formed by growing AlGaN on the initial layer. The buffer layer 2a is formed as a multilayer structure with a total thickness of about 500 nm by changing the proportion of Al in $Al_xGa_{1-x}N$ within a range of 0.2<x<0.8. Next, the electron transit layer 2b is formed by growing i-GaN on the buffer layer 2a to a thickness of about 1 μm. Next, the spacer layer 2c is formed by growing, for example, AlGaN on the electron transit layer 2b to a thickness of about 5 nm.

Next, the electron supply layer 2d is formed by growing, for example, AlGaN on the spacer layer 2c to a thickness of about 20 nm. The electron supply layer 2d is comprised of, for example, $Al_{0.2}Ga_{0.8}N$ and is formed as a multilayer structure including the Si-doped lower first layer 2d1 and the undoped upper second layer 2d2. The first layer 2d1 has a thickness of about 5 nm, and the second layer 2d2 has a thickness of about 15 nm. The Si concentration in the first layer 2d1 is at the maximum value at the interface with the spacer layer 2c and gradually decreases as the position becomes closer to the interface with the second layer 2d2. The maximum value of the Si concentration is preferably within a range between $1 \times 10^{18}/cm^3$ and $5 \times 10^{20}/cm^3$, and is more preferably within a range between $5 \times 10^{18}/cm^3$ and $5 \times 10^{19}/cm^3$. If the maximum value of the Si concentration is less than $1 \times 10^{18}/cm^3$, the contact resistance cannot be sufficiently reduced. If the maximum value of the Si concentration is greater than $5 \times 10^{20}/cm^3$, the reduction in the crystallinity (or generation of crystal defects) of the electron supply layer 2d becomes non-negligible.

As a growth condition for AlN, a mixed gas of a trimethylaluminum (TMA) gas and an ammonia ($NH_3$) gas is used as a source gas. As a growth condition for GaN, a mixed gas of a trimethylgallium (TMG) gas and an $NH_3$ gas is used as a source gas. As a growth condition for AlGaN, a mixed gas of a TMA gas, a TMG gas, and an $NH_3$ gas is used as a source gas. When InAlGaN is used, as its growth condition, a mixed gas of a trimethylindium (TMI) gas, a TMA gas, a TMG gas, and an $NH_3$ gas is used as a source gas. Depending on a compound semiconductor layer to be grown, the supply and the flow rates of the TMI gas (In source), the TMA gas (Al source), and the TMG gas (Ga source) are set appropriately. The flow rate of the ammonia gas, which is a common material, is set at a value within a range between about 100 ccm and about 10 LM. Also, the growth pressure is set at a value between about 50 Torr and about 300 Torr, and the growth temperature is set at a value between about 1000° C. and about 1200° C.

When growing the first layer $2d1$ of the electron supply layer $2d$, for example, an $SiH_4$ gas including Si is added to the source gas at a predetermined flow rate to dope AlGaN with Si. While forming the first layer $2d1$, the flow rate of the $SiH_4$ gas is gradually decreased from the maximum value to 0.

Figure 1B:
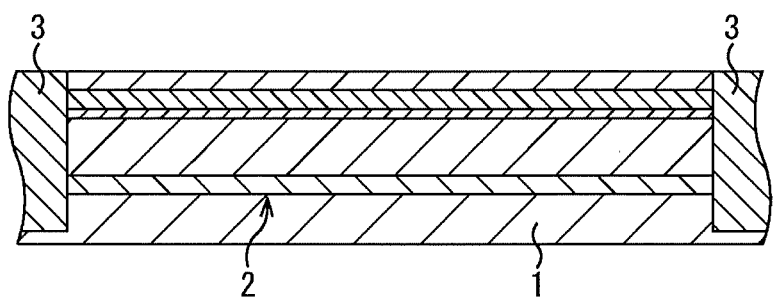
Figure 2:
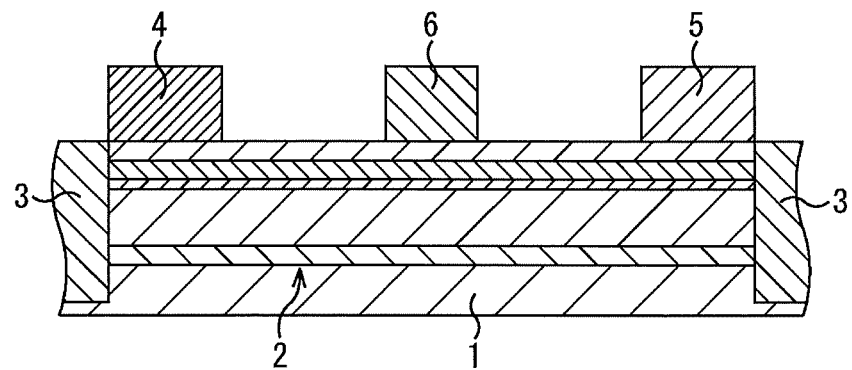
FIG. 2 is a drawing used to describe a method of manufacturing a GaN-HEMT according to the first embodiment.

Next, as illustrated in FIG. 1B, a device isolation structure 3 is formed.

For example, argon (Ar) is injected into device isolation regions of the compound semiconductor multilayer structure 2. As a result, the device isolation structure 3 is formed in the compound semiconductor multilayer structure 2 and the superficial portion of the Si substrate 1. The device isolation structure 3 defines an active region on the compound semiconductor multilayer structure 2.

Instead of the injection method, the device isolation may be performed by shallow trench isolation (STI). In this case, for example, a chlorine-based etching gas may be used for dry etching of the compound semiconductor multilayer structure 2.

Figure 1C:
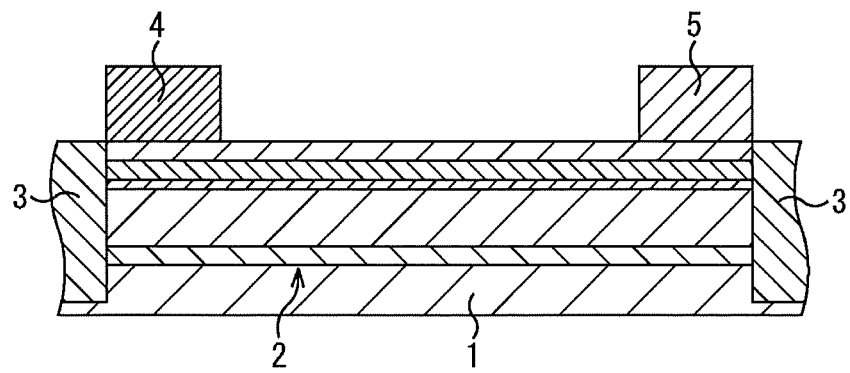

Next, as illustrated in FIG. 1C, a source electrode 4 and a drain electrode 5 are formed.

First, a resist mask for forming the source electrode 4 and the drain electrode 5 is formed. In this example, an eaves-structure two-layer resist suitable for a vapor deposition technique and a lift-off technique is used. The resist is applied to the compound semiconductor multilayer structure 2, and openings are formed in the resist to expose electrode-forming regions. As a result, a resist mask with the openings is formed.

For example, an electrode material such as Ta or Al is deposited by vapor deposition on the resist mask including the openings exposing the electrode-forming regions. The thickness of Ta is about 20 nm, and the thickness of Al is about 200 nm. Next, the resist mask and Ta or Al deposited on the resist mask are removed by a lift-off technique. Then, the Si substrate 1 is heat-treated in, for example, a nitrogen atmosphere at a temperature between 400°C. and 1000°C. (e.g., 600°C.) so that an ohmic contact is formed between remaining Ta or Al and the electron supply layer $2d$. As long as the ohmic contact can be formed between Ta or Al and the electron supply layer $2d$, the heat treatment may be omitted. Through the above process, the source electrode 4 and the drain electrode 5 are formed on the electron supply layer $2d$.

Next, as illustrated in FIG. 2, a gate electrode 6 is formed.

First, a resist mask for forming the gate electrode 6 is formed. In this example, an eaves-structure two-layer resist suitable for a vapor deposition technique and a lift-off technique is used. The resist is applied to the compound semiconductor multilayer structure 2, and an opening is formed in the resist by photolithography to expose an electrode-forming region on the electron supply layer $2d$. As a result, a resist mask with the opening is formed.

For example, an electrode material such as Ni or Au is deposited by vapor deposition on the resist mask including the opening for exposing the electrode-forming region. The thickness of Ni is about 30 nm, and the thickness of Au is about 400 nm. Next, the resist mask and Ni or Au deposited on the resist mask are removed by a lift-off technique. Through the above process, the gate electrode 6 is formed on the electron supply layer $2d$.

After the gate electrode 6 is formed, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the first embodiment.

Effects of the GaN-HEMT of the first embodiment are described in comparison with comparative examples.

Figure 3:
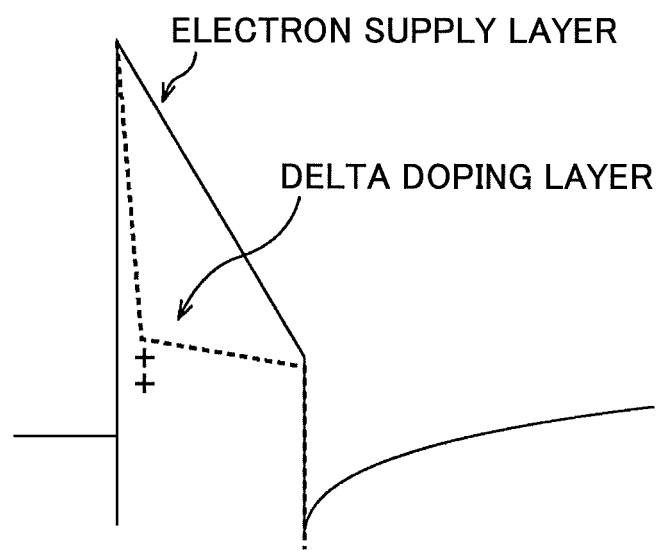
FIG. 3 is a drawing illustrating a band structure of a GaN-HEMT according to a comparative example 1.

A GaN-HEMT of a comparative example 1 includes no spacer layer. Instead, the GaN-HEMT of the comparative example 1 includes a δ doped layer formed by locally doping (δ doping) an inner portion of an electron supply layer with a high concentration of impurity to reduce the contact resistance. FIG. 3 is a drawing illustrating a band structure of the GaN-HEMT of the comparative example 1.

With the δ doped layer, the band profile of the inside of the electron supply layer is greatly modulated, and the thickness of a barrier against electrons moving between the source electrode (or the drain electrode) and the 2DEG is greatly reduced. As a result, the tunneling probability between the source electrode (or the drain electrode) and the 2DEG increases exponentially and the ohmic contact resistance is reduced.

Figure 4A:
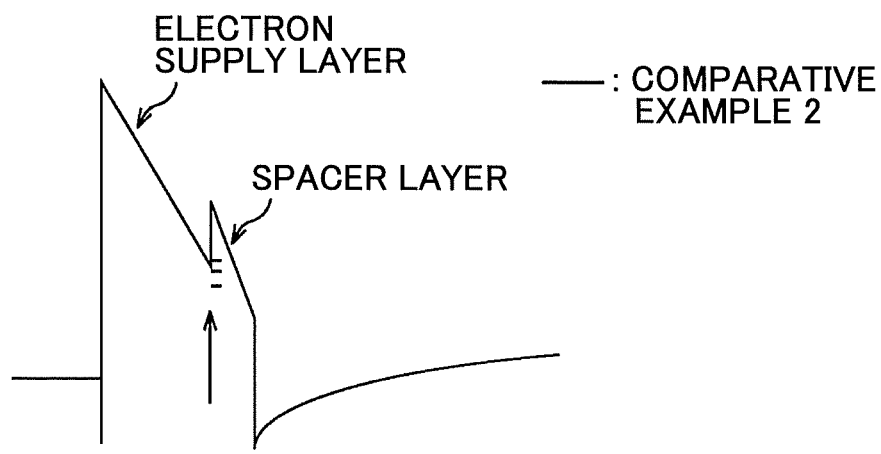
FIGS. 4A and 4B are drawings illustrating band structures of GaN-HEMTs according to comparative examples 2 and 3.
Figure 4B:
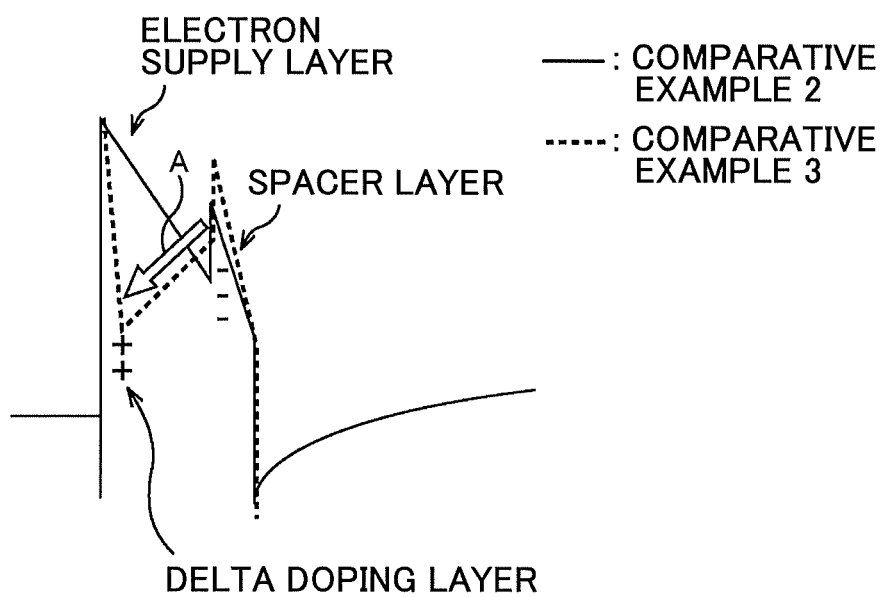

However, with a GaN-HEMT where a spacer layer is provided to improve the electron mobility of the 2DEG, the contact resistance is not effectively reduced even if δ doping is performed in the electron supply layer. A GaN-HEMT of a comparative example 2 includes a spacer layer but does not include a δ doped layer. A GaN-HEMT of a comparative example 3 includes a spacer layer and a δ doped layer. FIG. 4A illustrates a band structure of the GaN-HEMT of the comparative example 2, and FIG. 4B illustrates band structures of the GaN-HEMTs of the comparative examples 2 and 3. In FIGS. 4A and 4B, a solid line indicates the band structure of the comparative example 2, and a dotted line indicates the band structure of the comparative example 3.

As illustrated in FIG. 4A, in the comparative example 2, the polarization charge density of the spacer layer with a low electron affinity is high, and negative polarization charges exist at the interface between the electron supply layer and the spacer layer. When high-concentration δ doping is performed on the inner portion of the electron supply layer, electric lines of force are terminated between positive charges in the δ doped layer and the negative polarization charges at the interface between the electron supply layer and the spacer layer. For this reason, the band profile of the comparative example 3 rises from the δ doped layer toward the 2DEG as indicated by an arrow A in FIG. 4B. This indicates that there exists an electric field in a direction to push back electrons from the 2DEG side toward the upper surface. Also, the entire band profile of the electron supply layer and the spacer layer is not sufficiently lowered and as a result, the tunnel barrier at the interface is not sufficiently lowered. Thus, in a GaN-HEMT including a spacer layer, the negative polarization charges at the interface between the electron supply layer and the spacer layer reduce the contact resistance decreasing effect provided by the δ doped layer.

Figure 5:
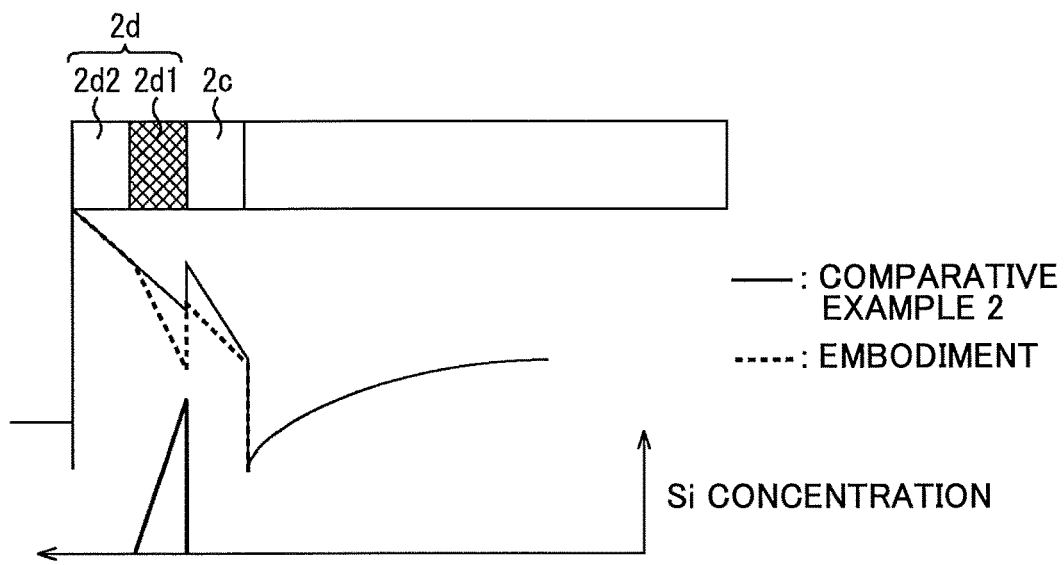
FIG. 5 is a drawing illustrating a band structure of a GaN-HEMT according to the first embodiment.

FIG. 5 is a drawing illustrating a band structure of the GaN-HEMT according to the first embodiment. In FIG. 5, a solid line indicates the band structure of the comparative example 2, and a dotted line indicates the band structure of the first embodiment.

In the GaN-HEMT of the first embodiment, the electron supply layer has a multilayer structure including an Si-doped first layer and an undoped second layer. In the first layer, the Si concentration is at the maximum value at the interface with the spacer layer and gradually decreases as the position becomes closer to the interface with the second layer. With this configuration, the increase of the potential at the interface between the electron supply layer and the spacer layer is suppressed, and the electric field in the electron supply layer has a uniform direction in which electrons are drawn from the upper surface of the electron supply layer into the electron transit layer. In this case, the negative polarization charges near the upper surface of the spacer layer are offset by Si in the first layer. Accordingly, this configuration makes it possible to effectively suppress the rise of the band profile and thereby reduce the contact resistance in a GaN-HEMT including a spacer layer.

Figure 6:
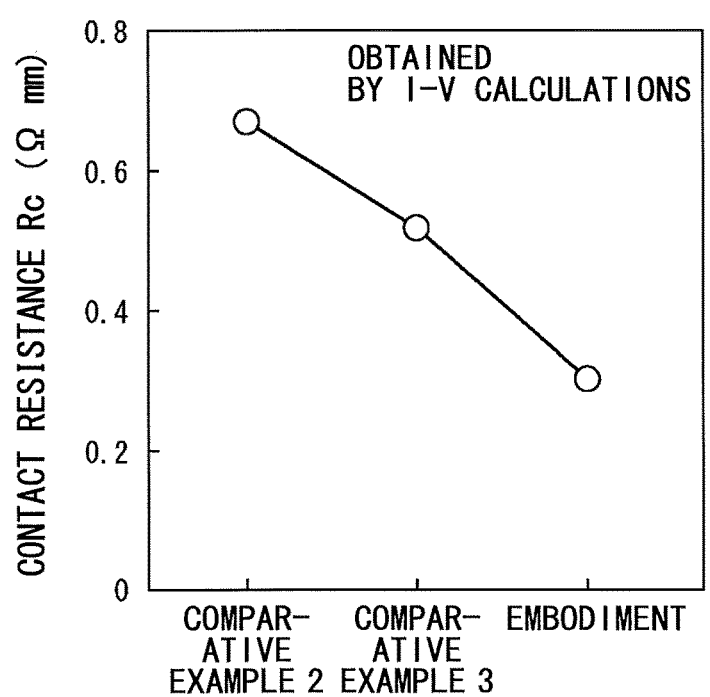
FIG. 6 is a graph illustrating contact resistances of GaN-HEMTs according to the comparative examples 1 and 2 and the first embodiment.

FIG. 6 is a graph illustrating contact resistances of GaN-HEMTs according to comparative examples and the first embodiment. In FIG. 6, the contact resistances are calculated based on simulation results of electron transport based on tunneling currents. In FIG. 6, it is assumed that the electron supply layer is comprised of $Al_{0.2}Ga_{0.8}N$ and has a thickness of 20 nm, and the spacer layer is comprised of AlN and has a thickness of 1 nm. The GaN-HEMT of the comparative example 2 includes a spacer layer but does not include a δ doped layer. The GaN-HEMT of the comparative example 3 includes a spacer layer and a δ doped layer.

In the GaN-HEMT of the comparative example 2, the contact resistance is about 0.7 Ωmm. When a GaN-HEMT includes neither the spacer layer nor the δ doped layer, the contact resistance is about 0.4 Ωmm. Accordingly, it is understood that, in the GaN-HEMT of the comparative example 2, the potential inside of the electron supply layer is increased by the negative polarization charges at the interface between the electron supply layer and the spacer layer and as a result, the electron transport between the ohmic electrodes (the source electrode and the drain electrode) formed on the electron supply layer and the 2DEG is suppressed.

The GaN-HEMT of the comparative example 3 includes the δ doped layer doped with Si at a position that is 5 nm away from the upper surface of the electron supply layer. For the calculation of the contact resistance, the thickness of the δ doped layer is set at 1 nm, and the Si concentration of the δ doped layer is set at $1\times10^{19}/cm^3$. With the configuration of the comparative example 3, due to the existence of the δ doped layer that forms positive fixed charges, the thickness of the barrier layer near the upper surface is decreased and the contact resistance is decreased to about 0.55 Ωmm. That is, the band profile near the upper surface of the electron supply layer becomes steep due to the existence of the δ doped layer and as a result, the contact resistance is reduced. However, with the configuration of the comparative example 3, because electric lines of force are terminated between negative charges at the upper surface of the spacer layer and positive charges in the δ doped layer, an electric field component, which is in a direction opposite the direction of an electric field component near the upper surface of the electron supply layer, is generated inside of the electron supply layer. This in turn suppresses the electron transport from the ohmic electrodes toward the 2DEG. It is understood that this is the reason why the contact resistance is not sufficiently decreased with the configuration of the comparative example 3.

The GaN-HEMT of the first embodiment includes an Si-doped first layer that is adjacent to the spacer layer. For the calculation of the contact resistance, the thickness of the first layer is set at 5 nm, and the maximum value of the Si concentration is set at $2\times10^{18}/cm^3$. With the configuration of the first embodiment, the contact resistance is further reduced to about 0.3 Ωmm, and excellent ohmic contact characteristics are obtained. This is achieved because the negative polarization charges at the upper surface of the spacer layer are offset by fixed charges in the first layer. With the configuration of the first embodiment, unlike the configuration including the δ doped layer, the potential at the interface between the electron supply layer and the spacer layer is reduced and no electric field component in the opposite direction is generated in the electron supply layer.

As described above, the first embodiment makes it possible to provide a highly-reliable GaN-HEMT where both the access resistance and the contact resistance are reduced.

<Second Embodiment>

Figure 7A:
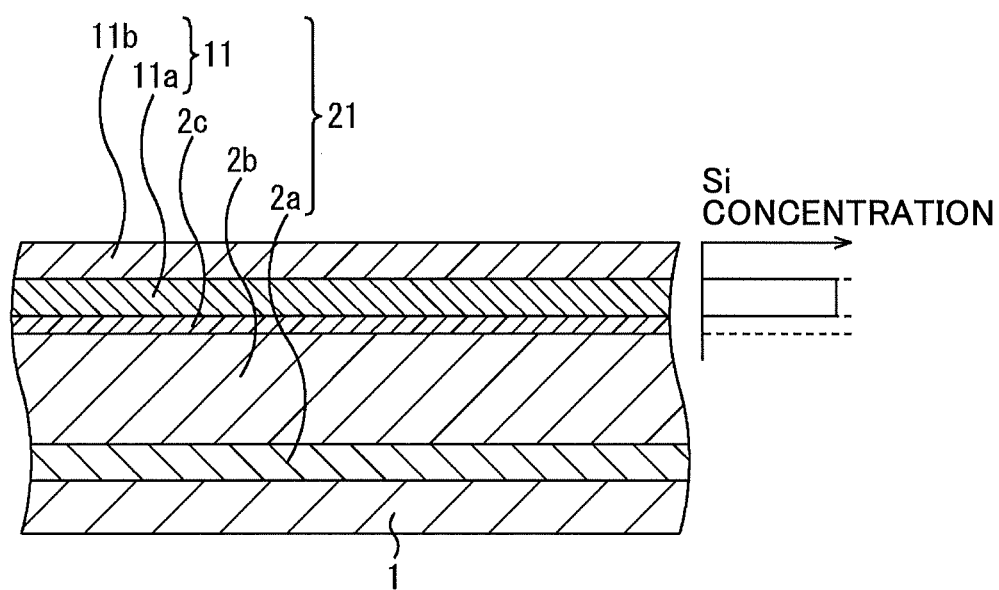
FIGS. 7A and 7B are drawings used to describe a method of manufacturing a GaN-HEMT according to a second embodiment.
Figure 7B:
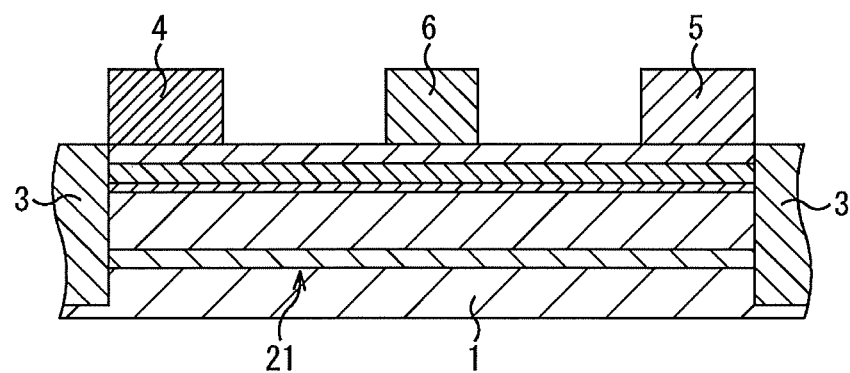

A GaN-HEMT of a second embodiment is different from the GaN-HEMT of the first embodiment in the configuration of the electron supply layer. FIGS. 7A and 7B are drawings used to describe a method of manufacturing the GaN-HEMT according to the second embodiment. The same reference numbers as in the first embodiment are assigned to components that are substantially the same as those of the GaN-HEMT of the first embodiment, and detailed descriptions of those components are omitted.

First, as illustrated by FIG. 7A, a compound semiconductor multilayer structure 21 is formed on an Si substrate 1.

The compound semiconductor multilayer structure 21 includes a buffer layer 2a, an electron transit layer 2b, a spacer layer 2c, and an electron supply layer 11.

In the second embodiment, the electron transit layer 2b is comprised of i-GaN, the spacer layer 2c is comprised of AlGaN or InAlGaN, and the electron supply layer 11 is comprised of AlGaN or InAlGaN. The relationship among the electron affinities of the electron transit layer 2b, the spacer layer 2c, and the electron supply layer 11 is represented by "electron transit layer 2b>electron supply layer 11>spacer layer 2c". This relationship ensures the electron confinement effect of the spacer layer 2c and improves the electron mobility. To achieve this relationship, when the space layer 2c is comprised of $Al_aGa_{1-a}N$ and the electron supply layer 11 is comprised of $Al_bGa_{1-b}N$, "a>b" and "0.1≤a≤1" need to be satisfied. Also, when the space layer 2c is comprised of $Al_aGa_{1-a}N$ and the electron supply layer 11 is comprised of $In_bAl_cGa_{1-b-c}N$, "a>c" and "b≥0" need to be satisfied.

The electron supply layer 11 has an n-type impurity concentration distribution where the n-type impurity is at a first concentration (maximum value) at the interface between the electron supply layer 11 and the spacer layer 2c and at a second concentration (minimum value) lower than the first concentration at the upper surface of the electron supply layer 11, and the concentration of the n-type impurity at one of arbitrarily-selected two positions closer to the upper surface in the thickness direction is less than the concentration of the n-type impurity at the other one of the two positions closer to the interface in the thickness direction. One or more elements selected from silicon (Si), germanium (Ge), and oxygen (O) are used as the n-type impurity. In the second embodiment, the electron supply layer 11 includes a lower first layer 11a doped with, for example, Si and an upper undoped second layer 11b stacked on the first layer 11a, and only the first layer 11a contains the n-type impurity with the concentration distribution described above.

As indicated by a graph on the right side of FIG. 7A, the entire first layer 11a is doped with Si at a uniform concentration. The spacer layer 2c may also be doped with Si. Forming the electron supply layer 11 having an Si concentration distribution as described above, i.e., having a high concentration of n-type impurity at the interface with the spacer layer 2c, makes it possible to reduce the contact resistance even when the spacer layer 2c is provided to reduce the access resistance. Thus, the configuration of the second embodiment makes it possible to reduce both the access resistance and the contact resistance.

The compound semiconductor multilayer structure 21 is formed by growing compound semiconductors on the Si substrate 1 by, for example, MOVPE as described below. Instead of MOVPE, any other appropriate method such as MBE may be used.

First, as an initial layer (not shown), AlN is grown on the Si substrate 1 to a thickness of about 160 nm. Next, the buffer layer 2a is formed by growing AlGaN on the initial layer. The buffer layer 2a is formed as a multilayer structure with a total thickness of about 500 nm by changing the proportion of Al in $Al_xGa_{1-x}N$ within a range of 0.2<x<0.8. Next, the electron transit layer 2b is formed by growing i-GaN on the buffer layer 2a to a thickness of about 1 μm. Next, the spacer layer 2c is formed by growing, for example, AlGaN on the electron transit layer 2b to a thickness of about 5 nm.

Next, the electron supply layer 11 is formed by growing, for example, AlGaN on the spacer layer 2c to a thickness of about 20 nm. The electron supply layer 11 is comprised of, for example, $Al_{0.2}Ga_{0.8}N$ and is formed as a multilayer structure including the Si-doped lower first layer 11a and the undoped upper second layer 11b. The first layer 11a has a thickness of about 5 nm, and the second layer 11b has a thickness of about 15 nm. The entire first layer 11a is doped with Si at a uniform concentration. The Si concentration is preferably within a range between $1\times10^{18}/cm^3$ and $5\times10^{20}/cm^3$, and is more preferably within a range between $5\times10^{18}/cm^3$ and $5\times10^{19}/cm^3$. If the Si concentration is less than $1\times10^{18}/cm^3$, the contact resistance cannot be sufficiently reduced. If the Si concentration is greater than $5\times10^{20}/cm^3$, the reduction in the crystallinity (or generation of crystal defects) of the electron supply layer 11 becomes non-negligible.

When growing the first layer 11a of the electron supply layer 11, for example, an $SiH_4$ gas including Si is added to the source gas at a predetermined flow rate to dope AlGaN with Si.

Next, similarly to the first embodiment, steps illustrated by FIGS. 1B, 1C, and 2 are performed. As a result, as illustrated by FIG. 7B, a source electrode 4, a drain electrode 5, and a gate electrode 6 are formed on the compound semiconductor multilayer structure 21.

Subsequently, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the second embodiment.

The second embodiment makes it possible to provide a highly-reliable GaN-HEMT where both the access resistance and the contact resistance are reduced.

<Third Embodiment>

Figure 8A:
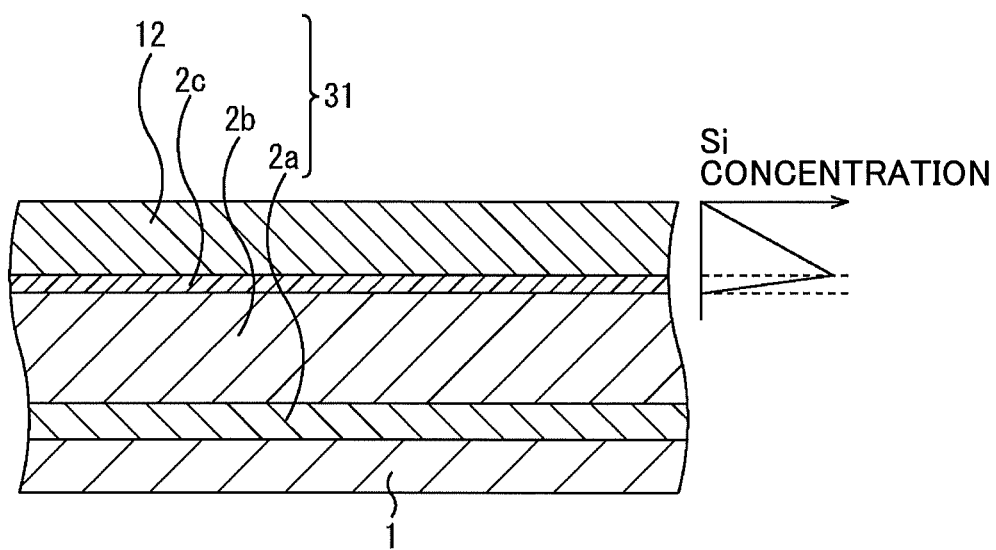
FIGS. 8A and 8B are drawings used to describe a method of manufacturing a GaN-HEMT according to a third embodiment.
Figure 8B:
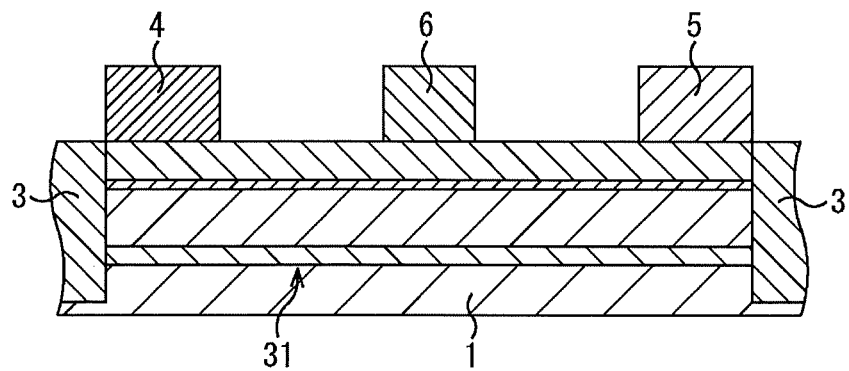

A GaN-HEMT of a third embodiment is different from the GaN-HEMT of the first embodiment in the configuration of the electron supply layer. FIGS. 8A and 8B are drawings used to describe a method of manufacturing the GaN-HEMT according to the third embodiment. The same reference numbers as in the first embodiment are assigned to components that are substantially the same as those of the GaN-HEMT of the first embodiment, and detailed descriptions of those components are omitted.

First, as illustrated by FIG. 8A, a compound semiconductor multilayer structure 31 is formed on an Si substrate 1.

The compound semiconductor multilayer structure 31 includes a buffer layer 2a, an electron transit layer 2b, a spacer layer 2c, and an electron supply layer 12.

In the third embodiment, the electron transit layer 2b is comprised of i-GaN, the spacer layer 2c is comprised of AlGaN or InAlGaN, and the electron supply layer 12 is comprised of AlGaN or InAlGaN. The relationship among the electron affinities of the electron transit layer 2b, the spacer layer 2c, and the electron supply layer 12 is represented by "electron transit layer 2b>electron supply layer 12>spacer layer 2c". This relationship ensures the electron confinement effect of the spacer layer 2c and improves the electron mobility. To achieve this relationship, when the space layer 2c is comprised of $Al_aGa_{1-a}N$ and the electron supply layer 12 is comprised of $Al_bGa_{1-b}N$, "a>b" and "0.1≤a≤1" need to be satisfied. Also, when the space layer 2c is comprised of $Al_aGa_{1-a}N$ and the electron supply layer 12 is formed of $In_bAl_cGa_{1-b-c}N$, "a>c" and "b≥0" need to be satisfied.

The electron supply layer 12 has an n-type impurity concentration distribution where the n-type impurity is at a first concentration (maximum value) at the interface between the electron supply layer 12 and the spacer layer 2c and at a second concentration (minimum value) lower than the first concentration at the upper surface of the electron supply layer 12, and the concentration of the n-type impurity at one of arbitrarily-selected two positions closer to the upper surface in the thickness direction is less than the concentration of the n-type impurity at the other one of the two positions closer to the interface in the thickness direction. One or more elements selected from silicon (Si), germanium (Ge), and oxygen (O) are used as the n-type impurity.

More specifically, in the electron supply layer 12, as indicated by a graph on the right side of FIG. 8A, the Si concentration is at the maximum value at the interface with the spacer layer 2c, gradually decreases as the distance from the interface increases (or as the position becomes closer to the upper surface of the electron supply layer 12), and becomes substantially zero at the upper surface. In this case, the spacer layer 2c is also doped with Si that is an n-type impurity. In the spacer layer 2c, the Si concentration is at the maximum value at the interface with the electron supply layer 12 and gradually decreases as the position becomes closer to the interface with the electron transit layer 2b. Forming the electron supply layer 12 having an Si concentration distribution as described above, i.e., having a high concentration of n-type impurity at the interface with the spacer layer 2c, makes it possible to reduce the contact resistance even when the spacer layer 2c is provided to reduce the access resistance. Thus, the configuration of the third embodiment makes it possible to reduce both the access resistance and the contact resistance. Further, with the above Si concentration distribution, it is possible to make the total amount of Si used as the n-type impurity as small as possible and prevent excessive Si doping. This in turn makes it possible to reduce the contact resistance without reducing the crystallinity of the electron supply layer 2d.

The compound semiconductor multilayer structure 31 is formed by growing compound semiconductors on the Si substrate 1 by, for example, MOVPE as described below. Instead of MOVPE, any other appropriate method such as MBE may be used.

First, as an initial layer (not shown), AlN is grown on the Si substrate 1 to a thickness of about 160 nm. Next, the buffer layer 2a is formed by growing AlGaN on the initial layer. The buffer layer 2a is formed as a multilayer structure with a total thickness of about 500 nm by changing the proportion of Al in $Al_xGa_{1-x}N$ within a range of 0.2<x<0.8. Next, the electron transit layer 2b is formed by growing i-GaN on the buffer layer 2a to a thickness of about 1 μm.

Next, the spacer layer 2c is formed by growing, for example, AlGaN on the electron transit layer 2b to a thickness of about 5 nm. The spacer layer 2c has an Si concentration distribution where the Si concentration is substantially zero at the interface with the electron transit layer 2b, gradually increases as the distance from the interface increases, and becomes the maximum value at the interface with the electron supply layer 12. The maximum value of the Si concentration in the spacer layer 2c corresponds to the maximum value of the Si concentration in the electron supply layer 12.

Next, the electron supply layer 12 is formed by growing, for example, AlGaN on the spacer layer 2c to a thickness of about 20 nm. The electron supply layer 12 is comprised of, for example, $Al_{0.2}Ga_{0.8}N$, and has an Si concentration distribution where the Si concentration is at the maximum value at the interface with the spacer layer 2c, gradually decreases as the position becomes closer to the upper surface of the electron supply layer 12, and becomes substantially zero at the upper surface. The maximum value of the Si concentration is preferably within a range between $1 \times 10^{18}/cm^3$ and $5 \times 10^{20}/cm^3$, and is more preferably within a range between $5 \times 10^{18}/cm^3$ and $5 \times 10^{19}/cm^3$. If the maximum value of the Si concentration is less than $1 \times 10^{18}/cm^3$, the contact resistance cannot be sufficiently reduced. If the Si concentration is greater than $5 \times 10^{20}/cm^3$, the reduction in the crystallinity (or generation of crystal defects) of the electron supply layer 12 becomes non-negligible.

When growing the electron supply layer 12, for example, an $SiH_4$ gas including Si is added to a source gas at a predetermined flow rate to dope AlGaN with Si.

Next, similarly to the first embodiment, steps illustrated by FIGS. 1B, 1C, and 2 are performed. As a result, as illustrated by FIG. 8B, a source electrode 4, a drain electrode 5, and a gate electrode 6 are formed on the compound semiconductor multilayer structure 31.

Subsequently, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the third embodiment.

The third embodiment makes it possible to provide a highly-reliable GaN-HEMT where both the access resistance and the contact resistance are reduced.

<Fourth Embodiment>

Figure 9A:
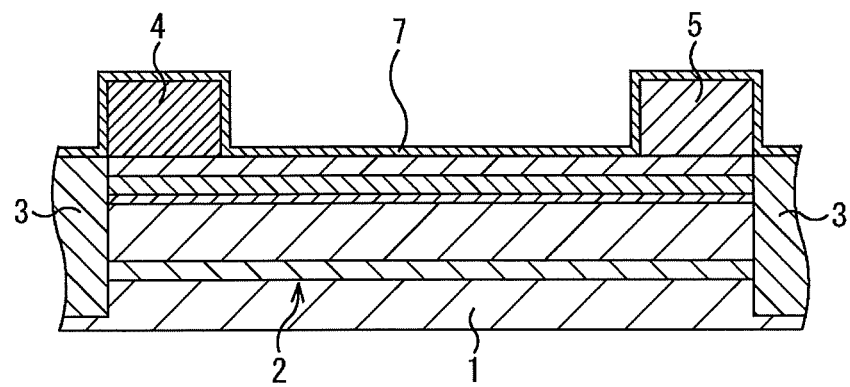
FIGS. 9A and 9B are drawings used to describe a method of manufacturing a GaN-HEMT according to a fourth embodiment.
Figure 9B:
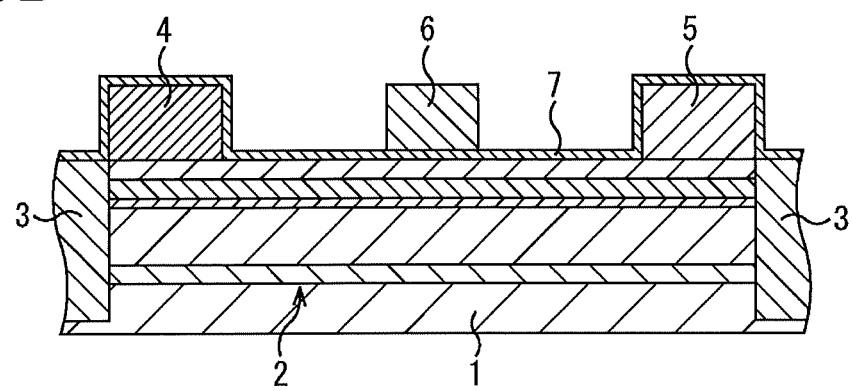

A fourth embodiment provides a metal insulator semiconductor (MIS) GaN-HEMT. FIGS. 9A and 9B are drawings used to describe a method of manufacturing the GaN-HEMT according to the fourth embodiment. The same reference numbers as in the first embodiment are assigned to components that are substantially the same as those of the GaN-HEMT of the first embodiment, and detailed descriptions of those components are omitted.

First, similarly to the first embodiment, steps illustrated by FIGS. 1A through 1C are performed.

Next, as illustrated in FIG. 9A, a gate insulation film 7 is formed.

For example, $Al_2O_3$ is deposited as an insulating material on the compound semiconductor multilayer structure 2. $Al_2O_3$ is deposited by, for example, atomic layer deposition (ALD) to a thickness between about 2 nm and 200 nm (in this example, about nm). As a result, the gate insulation film 7 is formed.

Instead of ALD, $Al_2O_3$ may be deposited by any other technique such as plasma CVD or sputtering. Also, instead of depositing $Al_2O_3$, a nitride or an oxynitride of Al may be deposited. Further, the gate insulation film 7 may be formed by depositing an oxide, a nitride, or an oxynitride of one of Si, Hf, Zr, Ti, Ta, and W, or may be formed as a multilayer structure by depositing two or more of these substances.

Next, as illustrated in FIG. 9B, a gate electrode 6 is formed.

First, a resist mask for forming the gate electrode 6 is formed. In this example, an eaves-structure two-layer resist suitable for a vapor deposition technique and a lift-off technique is used. The resist is applied to the compound semiconductor multilayer structure 2, and an opening is formed in the resist by photolithography to expose an electrode-forming region on the gate insulation film 7. As a result, a resist mask with the opening is formed.

For example, an electrode material such as Ni or Au is deposited by vapor deposition on the resist mask including the opening for exposing the electrode-forming region. The thickness of Ni is about 30 nm, and the thickness of Au is about 400 nm. Next, the resist mask and Ni or Au deposited on the resist mask are removed by a lift-off technique. Through the above process, the gate electrode 6 is formed on the gate insulation film 7.

After forming the gate electrode 6, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the fourth embodiment.

In the fourth embodiment, the gate insulation film 7 is formed immediately below the gate electrode 6. This configuration reduces the gate leakage current.

The fourth embodiment makes it possible to provide a highly-reliable GaN-HEMT where the gate leakage current and both of the access resistance and the contact resistance are reduced.

<Fifth Embodiment>

Figure 10A:
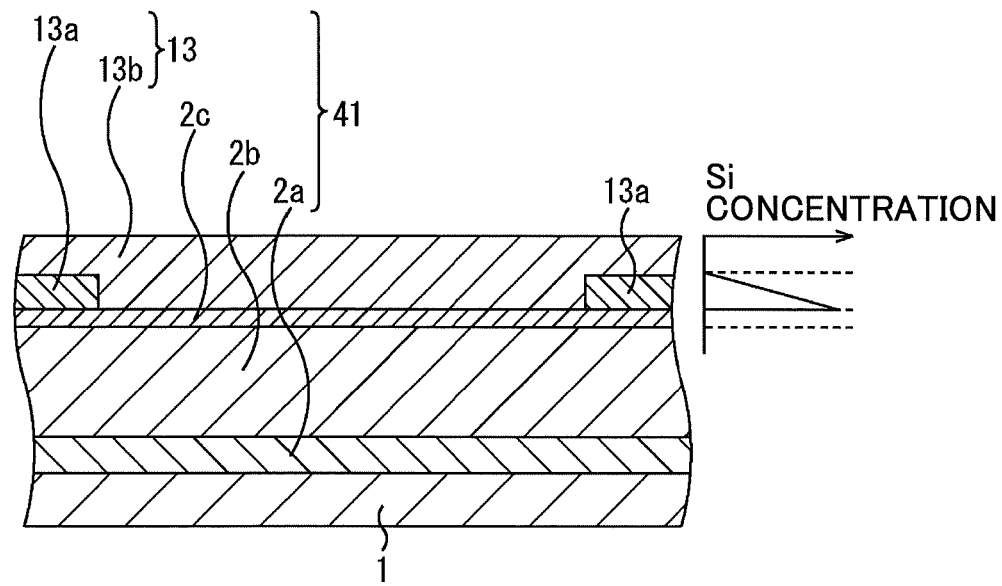
FIGS. 10A through 10C are drawings used to describe a method of manufacturing a GaN-HEMT according to a fifth embodiment.
Figure 10B:
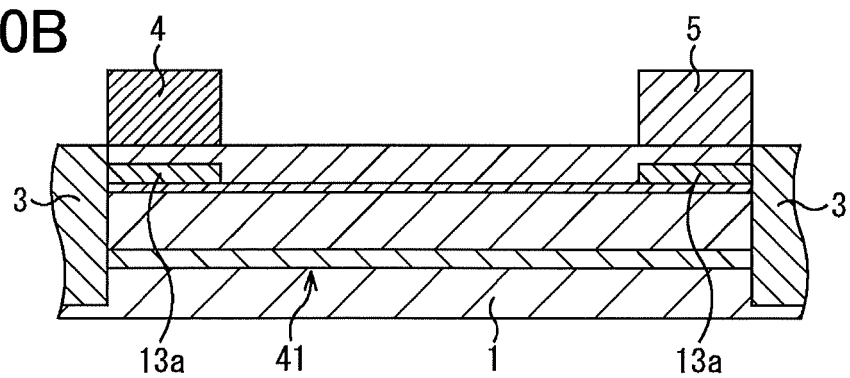
Figure 10C:
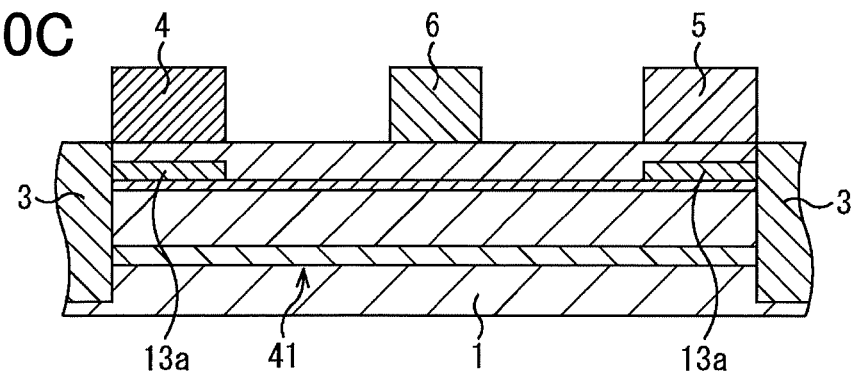

A GaN-HEMT of a fifth embodiment is different from the GaN-HEMT of the first embodiment in the configuration of the electron supply layer. FIGS. 10A through 10C are drawings used to describe a method of manufacturing the GaN-HEMT according to the fifth embodiment. The same reference numbers as in the first embodiment are assigned to components that are substantially the same as those of the GaN-HEMT of the first embodiment, and detailed descriptions of those components are omitted.

First, as illustrated by FIG. 10A, a compound semiconductor multilayer structure 41 is formed on an Si substrate 1.

The compound semiconductor multilayer structure 41 includes a buffer layer 2a, an electron transit layer 2b, a spacer layer 2c, and an electron supply layer 13.

In the fifth embodiment, the electron transit layer 2b is comprised of i-GaN, the spacer layer 2c is comprised of AlGaN or InAlGaN, and the electron supply layer 13 is comprised of AlGaN or InAlGaN. The relationship among the electron affinities of the electron transit layer 2b, the spacer layer 2c, and the electron supply layer 13 is represented by "electron transit layer 2b>electron supply layer 13>spacer layer 2c". This relationship ensures the electron confinement effect of the spacer layer 2c and improves the electron mobility. To achieve this relationship, when the space layer 2c is comprised of $Al_aGa_{1-a}N$ and the electron supply layer 13 is comprised of $Al_bGa_{1-b}N$, "a>b" and "$0.1 \le a \le 1$" need to be satisfied. Also, when the space layer 2c is comprised of $Al_aGa_{1-a}N$ and the electron supply layer 13 is formed of $In_bAl_cGa_{1-b-c}N$, "a>c" and "b≥0" need to be satisfied.

The electron supply layer 13 contains an n-type impurity only in portions corresponding to (or facing) regions where a source electrode 4 and a drain electrode 5 are to be formed. The electron supply layer has an n-type impurity concentration distribution where the n-type impurity is at a first concentration (maximum value) at the interface between the electron supply layer 13 and the spacer layer 2c and at a second concentration (minimum value) lower than the first concentration at the upper surface of the electron supply layer 13, and the concentration of the n-type impurity at one of arbitrarily-selected two positions closer to the upper surface in the thickness direction is less than the concentration of the n-type impurity at the other one of the two positions closer to the interface in the thickness direction. One or more elements selected from silicon (Si), germanium (Ge), and oxygen (O) are used as the n-type impurity. In the fifth embodiment, the electron supply layer 13 includes lower first layers 13a and an upper undoped second layer 13b. The first layers 13a are formed by, for example, Si doping in portions corresponding to (or facing) regions where the source electrode 4 and the drain electrode 5 are to be formed.

In the first layer 13a, as indicated by a graph on the right side of FIG. 10A, the Si concentration is at the maximum value at the interface with the spacer layer 2c and gradually decreases as the distance from the interface increases. The spacer layer 2c may also be doped with Si. Forming the electron supply layer 13 having an Si concentration distribution as described above, i.e., having a high concentration of n-type impurity at the interface with the spacer layer 2c, makes it possible to reduce the contact resistance even when the spacer layer 2c is provided to reduce the access resistance. Thus, the configuration of the fifth embodiment makes it possible to reduce both the access resistance and the contact resistance. Also, with the above Si concentration distribution, it is possible to make the total amount of Si used as the n-type impurity as small as possible and prevent excessive Si doping. This in turn makes it possible to reduce the contact resistance without reducing the crystallinity of the electron supply layer 13.

The compound semiconductor multilayer structure 41 is formed by growing compound semiconductors on the Si substrate 1 by, for example, MOVPE as described below. Instead of MOVPE, any other appropriate method such as MBE may be used.

First, as an initial layer (not shown), AlN is grown on the Si substrate 1 to a thickness of about 160 nm. Next, the buffer layer 2a is formed by growing AlGaN on the initial layer. The buffer layer 2a is formed as a multilayer structure with a total thickness of about 500 nm by changing the proportion of Al in $Al_xGa_{1-x}N$ within a range of 0.2<x<0.8. Next, the electron transit layer 2b is formed by growing i-GaN on the buffer layer 2a to a thickness of about 1 μm.

Next, the spacer layer 2c is formed by growing, for example, AlGaN on the electron transit layer 2b to a thickness of about 5 nm. Next, the second layer 13b of the electron supply layer 13 is formed by growing, for example, $Al_{0.2}Ga_{0.8}N$ on the spacer layer 2c to a thickness of about 20 nm.

Next, a resist is applied to the second layer 13b, and the resist is processed by photolithography to form a resist mask having openings for exposing only electrode-forming regions on the second layer 13b where the source electrode 4 and the drain electrode 5 are to be formed. Using the resist mask, Si used as the n-type impurity is ion-implanted into portions of the second layer 13b corresponding to (or facing) the electrode-forming regions. The ion implantation is performed such that lower portions of the second layer 13b corresponding to (or facing) the electrode-forming regions are doped with Si. As a result, the first layers 13a are formed in lower portions of the second layer 13b corresponding to (or facing) the electrode-forming regions.

The Si concentration in each of the first layers 13a is at the maximum value at the interface with the spacer layer 2c and gradually decreases as the position becomes closer to the interface with the second layer 13b. The maximum value of the Si concentration is preferably within a range between $1 \times 10^{18}/cm^3$ and $5 \times 10^{20}/cm^3$, and is more preferably within a range between $5 \times 10^{18}/cm^3$ and $5 \times 10^{19}/cm^3$. If the maximum value of the Si concentration is less than $1 \times 10^{18}/cm^3$, the contact resistance cannot be sufficiently reduced. If the Si concentration is greater than $5 \times 10^{20}/cm^3$, the reduction in the crystallinity (or generation of crystal defects) of the electron supply layer 13 becomes non-negligible.

Through the above process, the electron supply layer 13 including the first layers 13a and the second layer 13b is formed.

Next, as illustrated in FIG. 10B, the source electrode 4 and the drain electrode 5 are formed.

First, a resist mask for forming the source electrode 4 and the drain electrode 5 is formed. In this example, an eaves-structure two-layer resist suitable for a vapor deposition technique and a lift-off technique is used. The resist is applied to the compound semiconductor multilayer structure 41, and openings are formed in the resist to expose the electrode-forming regions above the first layers 13a. As a result, a resist mask with the openings is formed.

For example, an electrode material such as Ta or Al is deposited by vapor deposition on the resist mask including the openings exposing the electrode-forming regions. The thickness of Ta is about 20 nm, and the thickness of Al is about 200 nm. Next, the resist mask and Ta or Al deposited on the resist mask are removed by a lift-off technique. Then, the Si substrate 1 is heat-treated in, for example, a nitrogen atmosphere at a temperature between 400° C. and 1000° C. (e.g., 600°C). so that an ohmic contact is formed between remaining Ta or Al and the electron supply layer 13. As long as the ohmic contact can be formed between Ta or Al and the electron supply layer 13, the heat treatment may be omitted. Through the above process, the source electrode 4 and the drain electrode 5 are formed on the electron supply layer 13 in regions above the first layers 13a.

Next, as illustrated in FIG. 10C, a gate electrode 6 is formed.

First, a resist mask for forming the gate electrode 6 is formed. In this example, an eaves-structure two-layer resist suitable for a vapor deposition technique and a lift-off technique is used. The resist is applied to the compound semiconductor multilayer structure 41, and an opening is formed in the resist to expose an electrode-forming region corresponding to an undoped portion of the electron supply layer 13 that does not contain the n-type impurity (or a portion where the first layers 13a are not formed). As a result, a resist mask with the opening is formed.

For example, an electrode material such as Ni or Au is deposited by vapor deposition on the resist mask including the opening exposing the electrode-forming region. The thickness of Ni is about 30 nm, and the thickness of Au is about 400 nm. Next, the resist mask and Ni or Au deposited on the resist mask are removed by a lift-off technique. Through the above process, the gate electrode 6 is formed on the electron supply layer 13 in a region above the undoped portion not containing the n-type impurity (or a portion where the first layers 13a are not formed).

After forming the gate electrode 6, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the fifth embodiment.

In the fifth embodiment, the first layers 13a are formed only in portions of the electron supply layer 13 below the source electrode 4 and the drain electrode 5, and do not exist immediately below the gate electrode 6. This configuration reduces the gate leakage current.

The fifth embodiment makes it possible to provide a highly-reliable GaN-HEMT where the gate leakage current and both of the access resistance and the contact resistance are reduced.

<Sixth Embodiment>

Figure 11A:
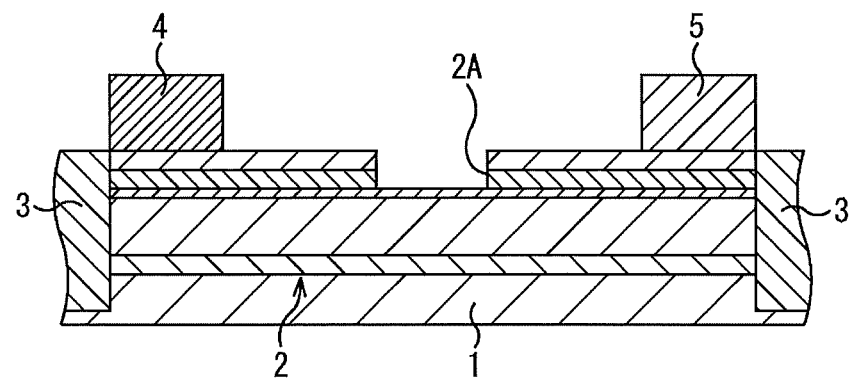
FIGS. 11A and 11B are drawings used to describe a method of manufacturing a GaN-HEMT according to a sixth embodiment.
Figure 11B:
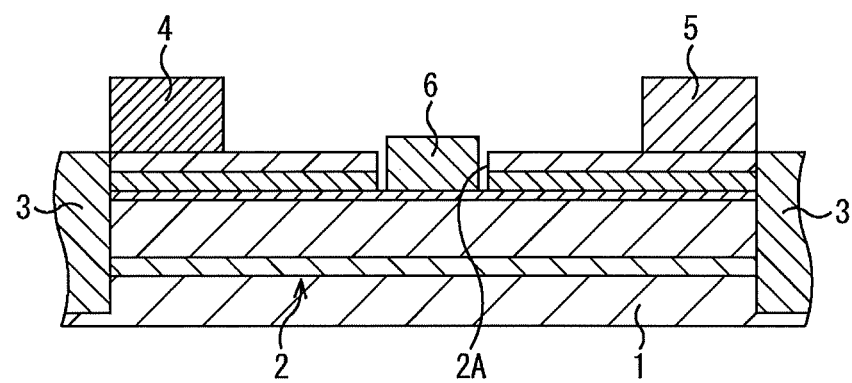

A GaN-HEMT of a sixth embodiment is different from the GaN-HEMT of the first embodiment in the configuration of the electron supply layer. FIGS. 11A and 11B are drawings used to describe a method of manufacturing the GaN-HEMT according to the fifth embodiment. The same reference numbers as in the first embodiment are assigned to components that are substantially the same as those of the GaN-HEMT of the first embodiment, and detailed descriptions of those components are omitted.

First, similarly to the first embodiment, steps illustrated by FIGS. 1A through 1C are performed.

Next, as illustrated in FIG. 11A, an electrode recess 2A for the gate electrode 6 is formed in the compound semiconductor multilayer structure 2.

More specifically, a resist is applied to the upper surface of the compound semiconductor multilayer structure 2. The resist is processed by photolithography to form an opening exposing a surface of the compound semiconductor multilayer structure 2 corresponding to an electrode-forming region where the gate electrode 6 is to be formed. As a result, a resist mask with the opening is formed.

Using the resist mask, a portion of the electron supply layer 2d corresponding to the electrode-forming region is removed by dry etching. As a result, the electrode recess 2A is formed. The electrode recess 2A is a groove that passes through the electron supply layer 2d and exposes a portion of the surface of the spacer layer 2c. The etching is performed using an inert gas such as Ar and a chlorine-based gas such as $Cl_2$ as etching gasses. As etching conditions, the flow rate of $Cl_2$ is set at 30 sccm, the pressure is set at 2 Pa, and the RF input power is set at 20 W.

The resist mask is removed by, for example, incineration.

Next, as illustrated in FIG. 11B, the gate electrode 6 is formed.

First, a resist mask for forming the gate electrode 6 is formed. In this example, an eaves-structure two-layer resist suitable for a vapor deposition technique and a lift-off technique is used. The resist is applied to the compound semiconductor multilayer structure 2, and the resist is processed by photolithography to form an opening for exposing the electrode recess 2A. As a result, a resist mask with the opening is formed.

For example, an electrode material such as Ni or Au is deposited by vapor deposition on the resist mask including the opening exposing the electrode recess 2A. The thickness of Ni is about 30 nm, and the thickness of Au is about 400 nm. Next, the resist mask and Ni or Au deposited on the resist mask are removed by a lift-off technique. Through the above process, the gate electrode 6 is formed by filling a part of the electrode recess 2A with the electrode material.

After forming the gate electrode 6, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the GaN-HEMT of the sixth embodiment.

In the sixth embodiment, the gate electrode 6 is formed in the electrode recess 2A formed in the electrode supply layer 2d, and the electrode supply layer 2d (including the first layer 2d1) is not present immediately below the gate electrode 6. This configuration reduces the gate leakage current.

The sixth embodiment makes it possible to provide a highly-reliable GaN-HEMT where the gate leakage current and both of the access resistance and the contact resistance are reduced.

<Seventh Embodiment>

A seventh embodiment provides a power-supply device including a GaN-HEMT of one of the first through sixth embodiments.

Figure 12:
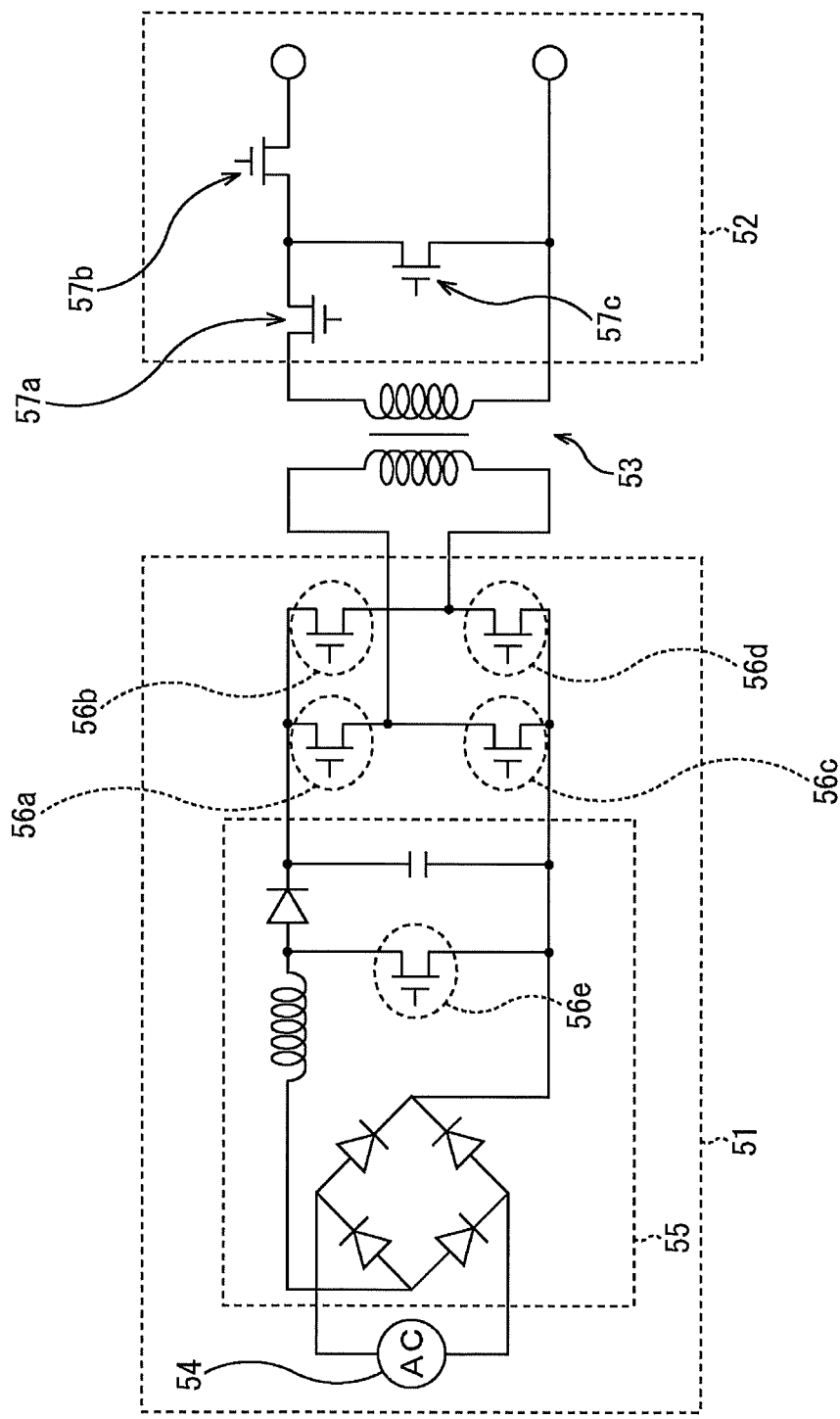
FIG. 12 is a circuit diagram illustrating a configuration of a power-supply device according to a seventh embodiment.

FIG. 12 is a circuit diagram illustrating a configuration of the power-supply device according to the seventh embodiment.

The power-supply device includes a high-voltage primary circuit 51, a low-voltage secondary circuit 52, and a transformer 53 disposed between the primary circuit 51 and the secondary circuit 52.

The primary circuit 51 includes an alternating-current power supply 54, a bridge rectifier circuit 55, and multiple (four in this example) switching elements 56a, 56b, 56c, and 56d. Also, the bridge rectifier circuit 55 includes a switching element 56e.

The secondary circuit 52 includes multiple (three in this example) switching elements 57a, 57b, and 57c.

In the seventh embodiment, each of the switching elements 56a, 56b, 56c, 56d, and 56e of the primary circuit 51 is implemented by one of the GaN-HEMTs of the first through sixth embodiments. The switching elements 57a, 57b, and 57c of the secondary circuit 52 are implemented by normal MIS-FETs using silicon.

The seventh embodiment provides a high-power, highly-reliable power-supply device that includes high-voltage GaN-HEMTs where the gate leakage current and both of the access resistance and the contact resistance are reduced.

<Eighth Embodiment>

An eighth embodiment provides a high-frequency amplifier including a GaN-HEMT of one of the first through sixth embodiments.

Figure 13:
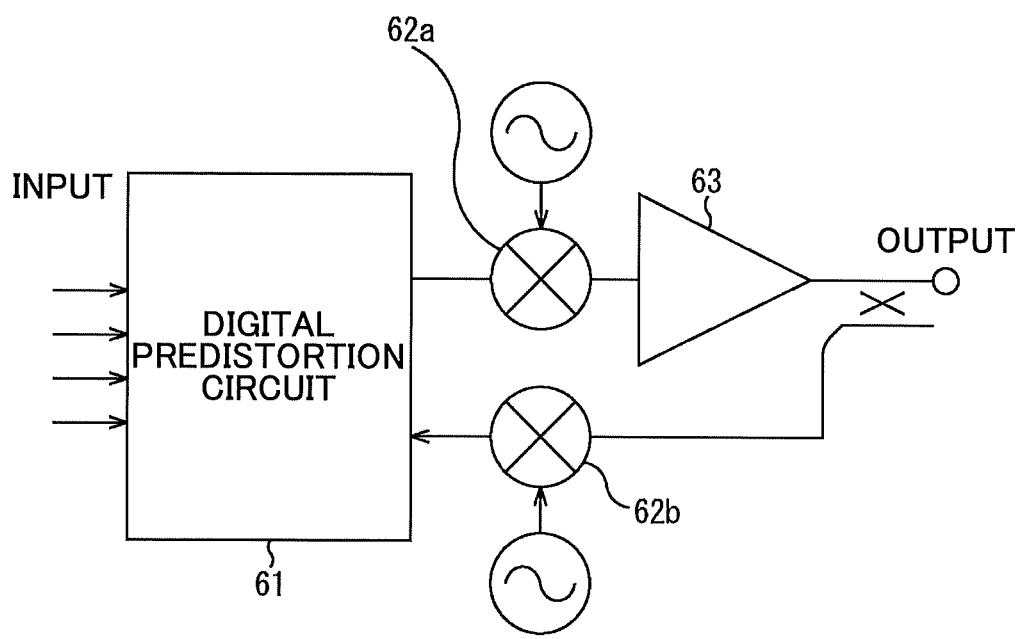
FIG. 13 is a drawing illustrating a configuration of a high-frequency amplifier according to an eighth embodiment.

FIG. 13 is a drawing illustrating a configuration of the high-frequency amplifier according to the eighth embodiment.

The high-frequency amplifier of the eighth embodiment includes a digital predistortion circuit 61, mixers 62a and 62b, and a power amplifier 63.

The digital predistortion circuit 61 compensates for nonlinear distortion of an input signal. Each of the mixers 62a and 62b mixes the input signal, whose nonlinear distortion has been compensated for, with an alternating current signal. The power amplifier 63 amplifies the input signal mixed with the alternating current signal and includes a GaN-HEMT of one of the first through sixth embodiments. In FIG. 13, an output signal can be switched to the mixer 62b and mixed with an alternating-current signal by the mixer 62b, and the mixed signal can be output to the digital predistortion circuit 61.

The eighth embodiment provides a highly-reliable, high-power, high-frequency amplifier that includes a high-voltage GaN-HEMT where the gate leakage current and both of the access resistance and the contact resistance are reduced.

An aspect of this disclosure provides a highly-reliable compound semiconductor device where both the access resistance and the contact resistance are reduced.

Another aspect of this disclosure provides a high-frequency amplifier that includes a transistor including an electron transit layer, a spacer layer disposed on the electron transit layer, and an electron supply layer disposed on the spacer layer and containing a donor impurity. The electron supply layer has a concentration distribution of the donor impurity where the donor impurity is at a first concentration at an interface between the electron supply layer and the spacer layer and at a second concentration lower than the first concentration at an upper surface of the electron supply layer, and a concentration of the donor impurity at one of arbitrarily-selected two positions closer to the upper surface in a thickness direction of the electron supply layer is less than the concentration of the donor impurity at another one of the two positions closer to the interface in the thickness direction.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a substrate;
   an electron transit layer that is disposed over the substrate and in which a two-dimensional electron gas is generated;
   a spacer layer disposed on the electron transit layer; and
   an electron supply layer disposed on the spacer layer and containing a donor impurity,
   the electron supply layer has a concentration distribution of the donor impurity where
   the donor impurity is at a first concentration at an interface between the electron supply layer and the spacer layer and at a second concentration lower than the first concentration at an upper surface of the electron supply layer, and
   a concentration of the donor impurity at one of arbitrarily-selected two positions closer to the upper surface in a thickness direction of the electron supply layer is less than the concentration of the donor impurity at another one of the two positions closer to the interface in the thickness direction.

2. The compound semiconductor device as claimed in claim 1, wherein
   the electron supply layer includes a lower first layer and an upper second layer; and
   only the first layer contains the donor impurity.

3. The compound semiconductor device as claimed in claim 2, wherein the concentration of the donor impurity in the first layer decreases as a distance from the interface increases.

4. The compound semiconductor device as claimed in claim 1, wherein
   the electron supply layer includes a lower first layer and an upper second layer; and
   only the first layer contains the donor impurity at a uniform concentration.

5. The compound semiconductor device as claimed in claim 1, wherein the concentration of the donor impurity in the electron supply layer decreases in a direction from the interface to the upper surface.

6. The compound semiconductor device as claimed in claim 1, wherein the spacer layer contains the donor impurity with a concentration distribution where a concentration of the donor impurity is at a maximum value at the interface between the electron supply layer and the spacer layer, and the concentration of the donor impurity gradually decreases toward an interface between the electron transit layer and the spacer layer.

7. The compound semiconductor device as claimed in claim 1, wherein
   the first concentration is a maximum value of the concentration distribution; and
   the maximum value is within a range between $1\times10^{18}/cm^3$ and $5\times10^{20}/cm^3$.

8. The compound semiconductor device as claimed in claim 7, wherein the maximum value is within a range between $5\times10^{18}/cm^3$ and $5\times10^{19}/cm^3$.

9. The compound semiconductor device as claimed in claim 1, wherein the donor impurity is one or more elements selected from silicon (Si), germanium (Ge), and oxygen (O).

10. The compound semiconductor device as claimed in claim 1, further comprising:
    an electrode disposed over the electron supply layer; and
    an insulation film disposed between the electron supply layer and the electrode.

11. The compound semiconductor device as claimed in claim 1, further comprising:
    an electrode disposed over the electron supply layer,
    wherein a portion of the electron supply layer disposed immediately below the electrode does not contain the donor impurity.

12. The compound semiconductor device as claimed in claim 1, further comprising:
    an electrode disposed in a groove that passes through the electron supply layer.

13. A power-supply device, comprising:
    a high-voltage circuit including a transistor;
    a low-voltage circuit; and
    a transformer disposed between the high-voltage circuit and the low-voltage circuit,
    the transistor includes
    a substrate;
    an electron transit layer that is disposed over the substrate and in which a two-dimensional electron gas is generated;
    a spacer layer disposed on the electron transit layer; and
    an electron supply layer disposed on the spacer layer and containing a donor impurity; and
    the electron supply layer has a concentration distribution of the donor impurity where
    the donor impurity is at a first concentration at an interface between the electron supply layer and the spacer layer and at a second concentration lower than the first concentration at an upper surface of the electron supply layer, and a concentration of the donor impurity at one of arbitrarily-selected two positions closer to the upper surface in a thickness direction of the electron supply layer is less than the concentration of the donor impurity at another one of the two positions closer to the interface in the thickness direction.

* * * * *